United States Patent [19]
Tanitsu

[11] Patent Number: 5,731,577
[45] Date of Patent: Mar. 24, 1998

[54] ILLUMINATION APPARATUS AND PROJECTION EXPOSURE APPARATUS USING THE SAME

[75] Inventor: Osamu Tanitsu, Funabashi, Japan

[73] Assignee: Nikon Corporation, Tokyo, Japan

[21] Appl. No.: 626,382

[22] Filed: Mar. 29, 1996

[30] Foreign Application Priority Data

Apr. 21, 1995 [JP] Japan .................. 7-120862

[51] Int. Cl.⁶ ............................ G01B 11/00
[52] U.S. Cl. ...................... 250/201.5; 250/548
[58] Field of Search ............... 250/201.5, 201.1, 250/548

[56] References Cited

U.S. PATENT DOCUMENTS

| | | | |
|---|---|---|---|
| 4,619,508 | 10/1986 | Shibuya et al. | 353/122 |
| 4,742,219 | 5/1988 | Ando | 250/201 |
| 4,851,978 | 7/1989 | Ichihara | 362/268 |
| 4,918,583 | 4/1990 | Kudo et al. | 362/268 |
| 4,970,546 | 11/1990 | Suzuki et al. | 355/53 |
| 5,138,176 | 8/1992 | Nishi | 250/548 |
| 5,153,419 | 10/1992 | Takahashi | 250/201.1 |
| 5,184,196 | 2/1993 | Nakagawa et al. | 356/401 |
| 5,237,367 | 8/1993 | Kudo | 355/67 |
| 5,307,207 | 4/1994 | Ichihara | 359/622 |

FOREIGN PATENT DOCUMENTS

| | | |
|---|---|---|
| 1-147516 | 6/1989 | Japan . |
| 6-196389 | 7/1994 | Japan . |
| 6-267894 | 9/1994 | Japan . |

Primary Examiner—Edward P. Westin
Assistant Examiner—Kevin Pyo
Attorney, Agent, or Firm—Foley & Lardner

[57] ABSTRACT

An illumination apparatus has at least one of a luminous flux angle adjustment means and a luminous flux translation means. Due to these luminous flux angle adjustment means and luminous flux translation means, the inclination and positional deviation of a luminous flux can be corrected with a high accuracy without finely adjusting the position of the light source. Accordingly, when this illumination apparatus is incorporated in a projection exposure apparatus, change in exposure light quantity and fluctuation in illuminance can be suppressed so as to stably effect exposure.

47 Claims, 7 Drawing Sheets

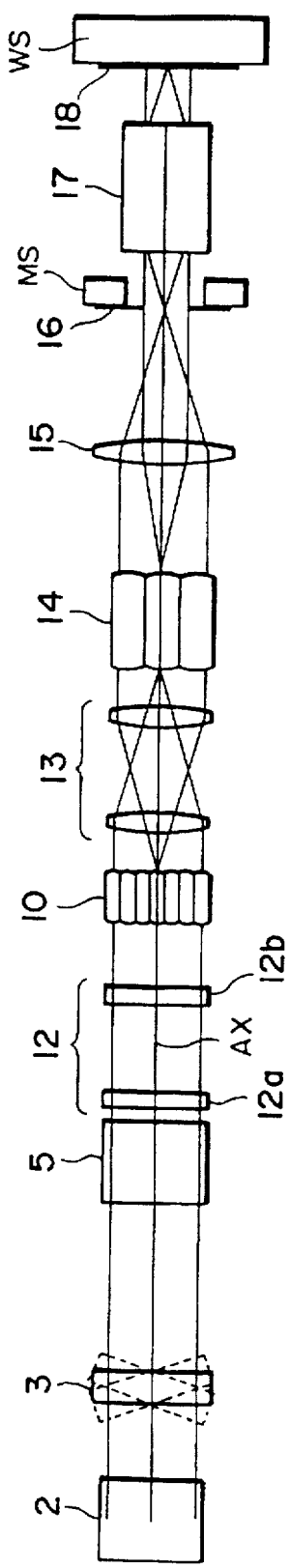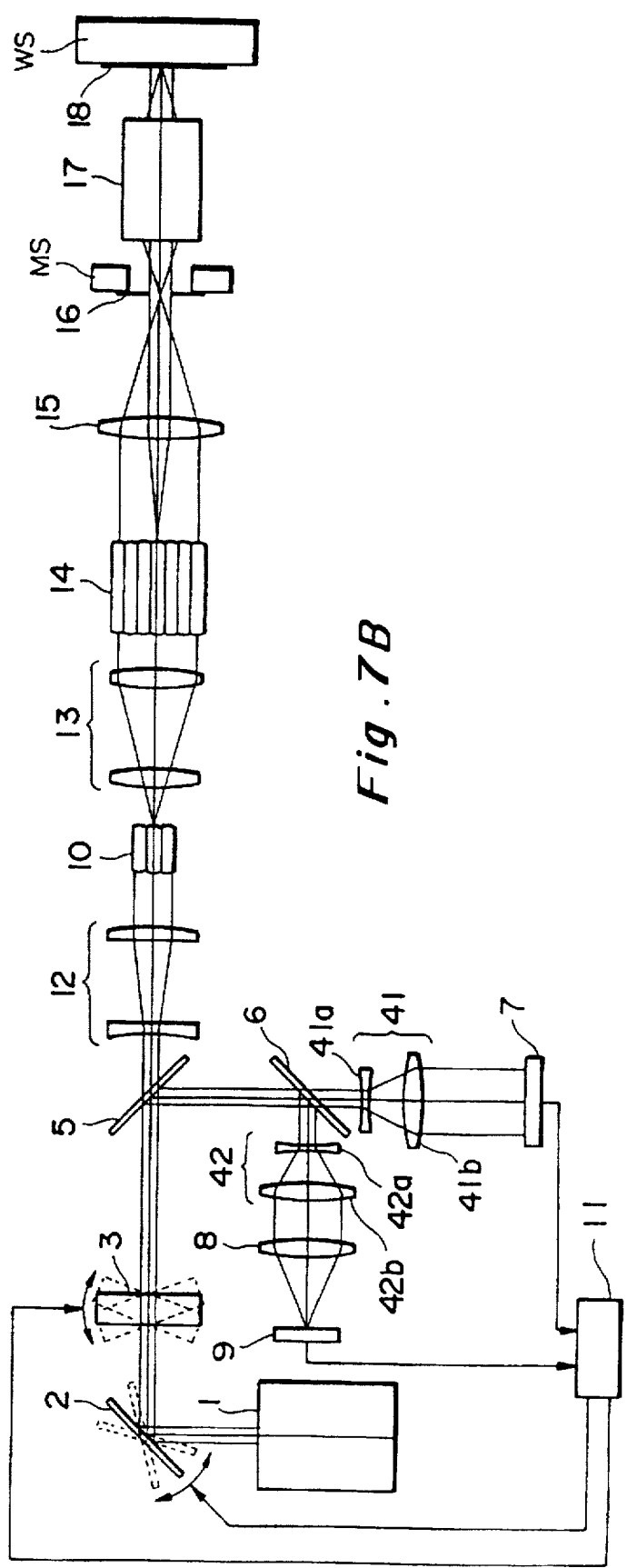

ILLUMINATION APPARATUS AND PROJECTION EXPOSURE APPARATUS USING THE SAME

BACKGROUND OF THE INVENTION

1. Field of the Invention

The present invention relates to an illumination apparatus and a projection exposure apparatus provided with this illumination apparatus. In particular, it relates to an illumination apparatus using an excimer laser as a light source, in which at least one of inclination and positional deviation of its illumination luminous flux can be corrected, and a projection exposure apparatus provided with this illumination apparatus.

2. Related Background Art

For example, as disclosed in Japanese Patent Laid-Open No. 61-244028, in the conventional illumination optical system for projection exposure apparatuses, it has been proposed to finely adjust the position of its light source so as to obtain illumination light with little inclination and positional deviation with respect to its designed optical axis.

The prior art such as that mentioned above is effective in a small light-emitting apparatus such as a mercury lamp. However, it is difficult to finely adjust the position of a huge light-emitting apparatus such as an excimer laser light source used in current projection exposure apparatuses. Accordingly, the prior art disclosed in Japanese Patent Laid-Open No. 61-244028 may not be suitably applied to illumination optical systems having a huge light-emitting apparatus such as an excimer laser light source.

The luminous flux emitted from the excimer laser has a rectangular cross section with a large aspect ratio. Accordingly, when the rectangular luminous flux from the excimer laser is made incident, as it is, on a photodetector such as a four-divided sensor, its detection accuracy in the longitudinal direction may differ from that in the lateral direction due to the difference between the luminous flux size in the longitudinal direction and that in the lateral direction.

Specifically, when the angle of a luminous flux emitted from the excimer laser with respect to its designed optical axis, namely, its inclination, is to be detected, the luminous flux is converged by way of a condenser lens so as to form a spot on a four-divided sensor. As mentioned above, the luminous flux emitted from the excimer laser has a rectangular luminous flux with a large aspect ratio, the spot formed on the four-divided sensor does not have a circular shape but has a flat ellipsoidal shape. As a result, the detection accuracy in the longitudinal direction and that in the lateral direction may greatly differ from each other.

On the other hand, when the displacement of the luminous flux emitted from the excimer laser with respect to the designed optical axis, namely, its positional deviation, is to be detected, the luminous flux is still made incident on the four-divided sensor still as a parallel luminous flux without being converged. Accordingly, on the four-divided sensor, the rectangular luminous flux having a large aspect ratio is received. As a result, the detection accuracy in the longitudinal direction and that in the lateral direction may greatly differ from each other.

In particular, in a so-called scan type projection exposure apparatus in which a mask and a photosensitive substrate are exposed to light while each is being scanned with respect to a projection optical system, inclination or positional deviation of a luminous flux incident on an optical integrator may occur due to vibrations of the projection exposure apparatus even during its exposure step. As a result, the exposure light quantity may change or illuminance may fluctuate, thereby making it difficult to stably perform the exposure step.

SUMMARY OF THE INVENTION

In view of the foregoing problems of the prior art, an object of the present invention is to provide an illumination apparatus which can correct at least one of inclination and positional deviation of its illumination luminous flux with high accuracy without finely adjusting the position of the light source.

Another object of the present invention is to provide a projection exposure apparatus which can correct the inclination or positional deviation of the luminous flux incident on its optical integrator with high accuracy, whereby exposure can be performed stably.

One aspect of the present invention is an illumination apparatus comprising:

light supply means for supplying a parallel luminous flux;

luminous flux shaping means for shaping the parallel luminous flux supplied from the light supply means into a parallel luminous flux having substantially a square or circular cross section;

positional deviation detecting means for detecting, based on the parallel luminous flux having substantially a square or circular cross section shaped by the luminous flux shaping means, a positional deviation of the parallel luminous flux supplied from the light supply means with respect to a predetermined optical axis; and luminous flux translation means for translating, based on an output from the positional deviation detecting means, the parallel luminous flux with respect to the predetermined optical axis so as to correct the positional deviation.

Another aspect of the present invention is an illumination apparatus comprising:

light supply means for supplying a parallel luminous flux;

luminous flux shaping means for shaping the parallel luminous flux supplied from the light supply means into a parallel luminous flux having substantially a square or circular cross section;

inclination detecting means for detecting, based on the parallel luminous flux having substantially a square or circular cross section shaped by the luminous flux shaping means, an inclination of the parallel luminous flux supplied from the light supply means with respect to a predetermined optical axis; and luminous flux angle adjustment means for adjusting, based on an output from the inclination detecting means, an angle of the parallel luminous flux with respect to the predetermined optical axis.

Still another aspect of the present invention is a projection exposure apparatus comprising:

an illumination apparatus including light supply means for supplying a parallel luminous flux; luminous flux shaping means for shaping the parallel luminous flux supplied from the light supply means into a parallel luminous flux having substantially a square or circular cross section; positional deviation detecting means for detecting, based on the parallel luminous flux having substantially a square or circular cross section shaped by the luminous flux shaping means, a positional deviation of the parallel luminous flux supplied from the light supply means with respect to predetermined optical axis; and a luminous flux translation means for translating, based on an output from the positional deviation detecting means, the parallel luminous flux with respect to the predetermined optical axis so as to correct the positional deviation;

an exposure illumination optical system having an optical integrator for irradiating a mask formed with a predetermined pattern with the parallel luminous flux from the illumination apparatus byway of the optical integrator; and a projection optical system for forming a pattern image from the mask upon a photosensitive substrate.

Still another aspect of the present invention is a projection exposure apparatus comprising:

an illumination apparatus including light supply means for supplying parallel luminous flux; a luminous flux shaping means for shaping the parallel luminous flux supplied from the light supply means into a parallel luminous flux having substantially a square or circular cross section; inclination detecting means for detecting, based on the parallel luminous flux having substantially a square or circular cross section shaped by the luminous flux shaping means, an inclination of the parallel luminous flux supplied from the light supply means with respect to a predetermined optical axis; and luminous flux angle adjustment means for adjusting, based on an output from the inclination detecting means, an angle of the parallel luminous flux with respect to the predetermined optical axis;

an exposure illumination optical system having an optical integrator for irradiating a mask formed with a predetermined pattern with the parallel luminous flux from the illumination apparatus by way of the optical integrator; and a projection optical system for forming a pattern image from the mask upon a photosensitive substrate.

Still another aspect of the present invention is a projection exposure apparatus comprising:

a first supporting member for supporting a mask formed with a predetermined pattern;

a second supporting member for supporting a photosensitive substrate;

an illumination optical system disposed in association with the mask for illuminating the mask;

a projection optical system disposed between the mask and the photosensitive substrate for forming a pattern image of the mask upon the photosensitive substrate;

wherein the illumination optical system includes a light supply unit for supplying a light flux; a light flux shaping unit disposed in a light path of the light flux supplied from the light supply unit for shaping the light flux into a light flux having a predetermined cross section shape; a positional deviation detecting unit for detecting a positional deviation of the light flux supplied from the light supply unit with respect to a predetermined optical axis; and a light flux translation unit for translating, based on an output from the positional deviation detecting unit, the light flux with respect to the predetermined optical axis so as to correct the positional deviation.

Still another aspect of the present invention is a projection exposure apparatus comprising:

a first supporting member for supporting a mask formed with a predetermined pattern;

a second supporting member for supporting a photosensitive substrate;

an illumination optical system disposed in association with the mask for illuminating the mask;

a projection optical system disposed between the mask and the photosensitive substrate for forming a pattern image of the mask upon the photosensitive substrate;

wherein the illumination optical system includes a light supply unit for supplying a light flux; a light flux shaping unit disposed in a light path of the light flux supplied from the light supply unit for shaping the light flux into a light flux having a predetermined cross section shape; an inclination detecting unit for detecting an inclination of the light flux supplied from the light supply unit with respect to a predetermined optical axis; and a light flux angle adjustment unit for adjusting, based on an output from the inclination detecting unit, an angle of the light flux with respect to the predetermined optical axis.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 7A and 7B are schematic configurational views showing the projection exposure apparatus in accordance with Embodiment 3 of the present invention.

DESCRIPTION OF THE PREFERRED EMBODIMENTS

In the following, embodiments of the present invention will be explained with reference to attached drawings.

Embodiment 1

Figure 1:
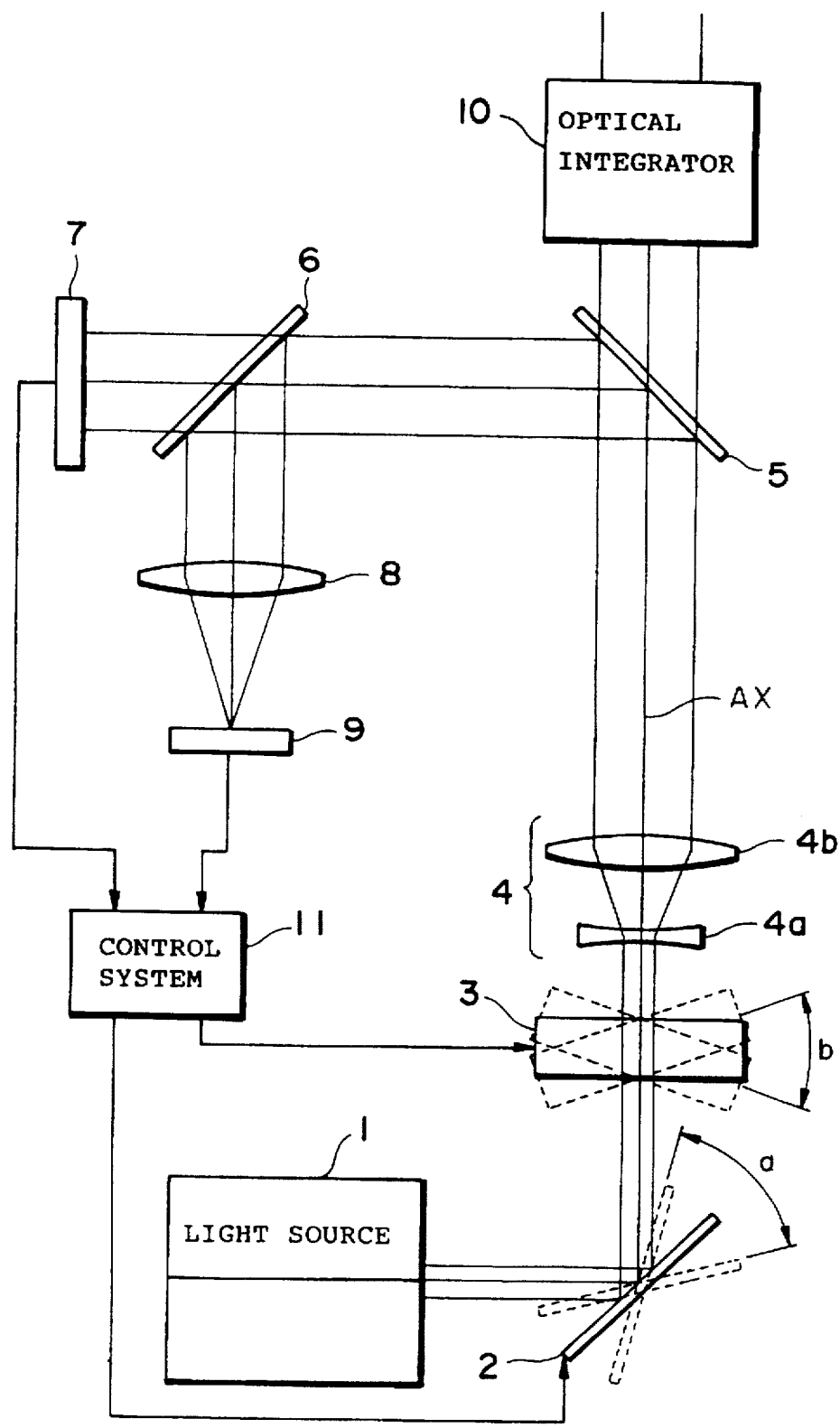
FIG. 1 is a schematic configurational view showing the illumination apparatus in accordance with Embodiment 1 of the present invention.

FIG. 1 is a schematic view showing the configuration of an illumination apparatus in accordance with Embodiment 1 of the present invention.

The depicted apparatus has a light source 1 which is a light supply such as excimer laser. The excimer laser 1 emits a rectangular parallel luminous flux which is incident on a mirror 2 used for adjusting the angle of the luminous flux with respect to its designed optical axis AX.

Here, when the mirror 2 rotates as indicated by arrow a within the paper surface of FIG. 1, the angle of the luminous flux with respect to the designed optical axis AX changes within the paper surface. The mirror 2 is driven to rotate such that the inclination of the luminous flux with respect to the designed optical axis AX can be corrected in all the in-plane directions.

Namely, a driving mechanism for the mirror 2, for example, comprises two motors which have output shafts orthogonal to each other and can be driven independently from each other. By this driving mechanism, the mirror 2 is rotated in two in-plane directions orthogonal to each other.

The luminous flux reflected by the mirror 2 is made incident on a plane parallel plate 3 which is a luminous flux translation unit for translating the luminous flux with respect to the designed optical axis AX. Here, when the plane parallel plate 3 rotates as indicated by arrow b within the paper surface of FIG. 1, the luminous flux is translated with respect to the designed optical axis AX. The plate 3 is driven to rotate such that the positional deviation of the luminous flux with respect to the designed optical axis AX can be corrected in all the in-plane directions.

Namely, like the driving mechanism for the mirror 2, a driving mechanism for the plane parallel plate 3, for example, comprises two motors which have output shafts orthogonal to each other and can be driven independently from each other. By this driving mechanism, the plane parallel plate 3 is rotated in two in-plane directions orthogonal to each other.

The luminous flux transmitted through the plane parallel plate 3 enters a cylinder expander 4, which is a luminous flux shaping unit comprising a pair of cylindrical lenses 4a and 4b. Each of the cylindrical lenses 4a and 4b has a refractive power within the paper surface of FIG. 1 while functioning as a plane parallel plate within a plane which includes the optical axis AX and is orthogonal to the paper surface. Accordingly, the luminous flux incident on the cylinder expander 4 is enlarged within the paper surface of FIG. 1 and, after being shaped into a luminous flux having substantially a square cross section, impinges on a half mirror 5.

The light transmitted through the half mirror 5 illuminates, by way of an optical integrator 10 having substantially a square inlet surface, an object which is not depicted. The light reflected by the half mirror 5, on the other hand, impinges on another half mirror 6.

The light reflected by the half mirror 6 forms an image, by way of a condenser lens 8, upon a four-divided sensor 9. The four-divided sensor 9 can take out a difference signal from diagonal areas in its four divided areas, thereby detecting the inclination of the luminous flux transmitted through the cylinder expander 4 with respect to the optical axis AX. The output of the four-divided sensor 9 is input into a control system 11.

On the other hand, the light transmitted through the half mirror 6 is guided, still as a parallel luminous flux, onto another four-divided sensor 7. Thus, the four-divided sensor 7 can detect the positional deviation of the luminous flux transmitted through the cylinder expander 4 with respect to the optical axis AX. The output of the four-divided sensor 7 is also input into the control system 11.

In this manner, information data concerning the inclination and positional deviation of the luminous flux are input into the control system 11 by way of their respective sensors. Based on this input information, the control system 11 drives and controls the mirror 2 and the plane parallel plate 3. Then, it rotates the mirror 2 so as to adjust the angle of the luminous flux with respect to the optical axis AX, thereby correcting the inclination of the luminous flux; while rotating the plane parallel plate 3 so as to translate the luminous flux with respect to the optical axis AX, thereby correcting the positional deviation of the luminous flux.

Thus, the half mirror 5 is a light path dividing unit for dividing the light path of the illumination apparatus into a main light path and a sensor light path. Accordingly, the half mirror 5 has such an optical characteristic that most of light is transmitted therethrough, while only a few percent of light is reflected thereby. When the reflective surface of the half mirror 5 is formed by a non-coated surface with no anti-reflection coating deposited thereon, fluctuation of the reflectivity upon energy irradiation can be suppressed.

On the other hand, the half mirror 6 divides the light, which has been taken out from the main optical path to the sensor optical path, into two light components which are respectively received by two sensors. Accordingly, when the half mirror 6 is constituted so as to have substantially a 50/50-reflectivity characteristic, it can equally divide the luminous flux with respect to the two sensors 7 and 9. As a result, the two sensors 7 and 9 can respectively detect the positional deviation and inclination of the luminous flux with high accuracy.

In the illumination apparatus of this embodiment, the optical integrator 10 has substantially a square inlet surface. Accordingly, the luminous flux is shaped into substantially a square cross section by the cylinder expander 4 between the half mirror 5 and the light source 1. By contrast, when the optical integrator 10 has a rectangular inlet surface, it is required that the luminous flux be shaped into substantially a square cross section by a first shaping optical system between the half mirror 5 and the half mirror 6 and be shaped into a form coinciding with the inlet surface of the optical integrator 10 by a second shaping optical system between the half mirror 5 and the optical integrator 10.

Figure 2:
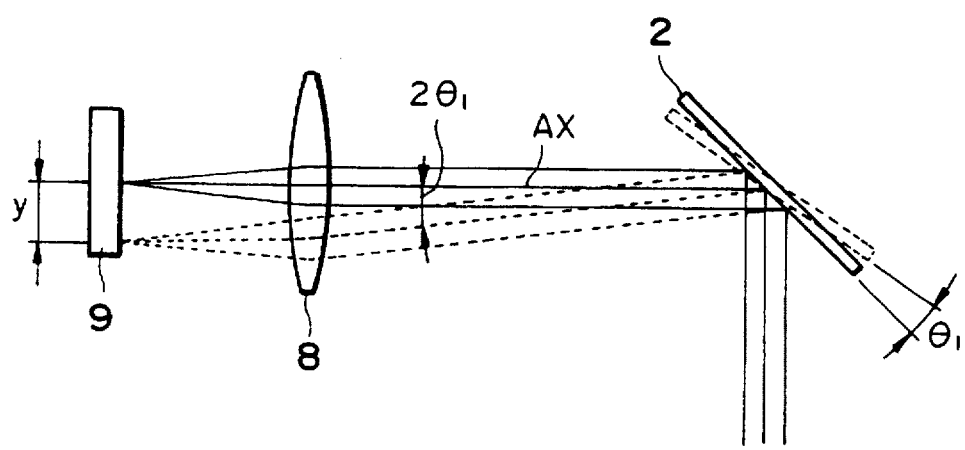
FIG. 2 is a schematic view explaining the principle of detecting an inclination of a luminous flux.

FIG. 2 is a schematic view explaining, in further detail, the principle of detecting the above-mentioned inclination of the luminous flux.

As shown in FIG. 2, a parallel luminous flux from an excimer laser, for example, impinges on the mirror 2 used for changing the angle of the luminous flux with respect to its designed optical axis AX. When the mirror 2 is disposed as indicated by a continuous line in this drawing, the luminous flux reflected by the mirror 2 is made incident on the condenser lens 8 along the designed optical axis AX. Then, a spot centered at the optical axis AX is formed at a center area on the four-divided sensor 9 positioned on the focal position of the condenser lens 8.

On the other hand, when the mirror 2 is rotated by an angle $\theta_1$ within the paper surface of FIG. 2 to a position indicated by a broken line, the luminous flux reflected by the mirror 2 is made incident on the condenser lens 8 while being inclined by an angle $2\theta_1$ with respect to the designed optical axis AX. Then, on the four-divided sensor 9, a spot is formed at a position separated by a distance y from its center (i.e., optical axis AX).

The distance y is expressed by the following equation (1):

$$y = f_1 \cdot \tan 2\theta_1 \tag{1}$$

wherein $f_1$ is the focal length of the condenser lens 8.

Thus, based on the sum signal and difference signal of the light incident on the four light-receiving portions of the four-divided sensor 9, the position of the spot on the four-divided sensor 9 (i.e., the distance y from its center) and, accordingly, the inclination $2\theta_1$ of the luminous flux with respect to the designed optical axis AX can be detected.

Figure 3A:
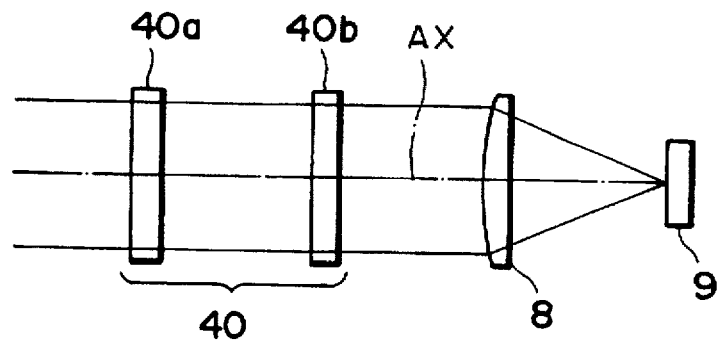
FIGS. 3A to 3C are schematic views explaining operations of an inclination detecting units for a luminous flux.
Figure 3B:
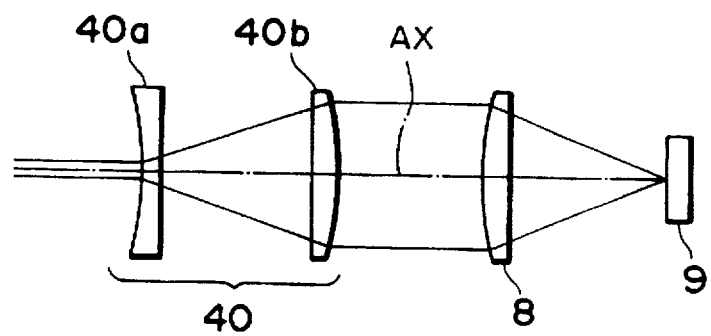
Figure 3C:
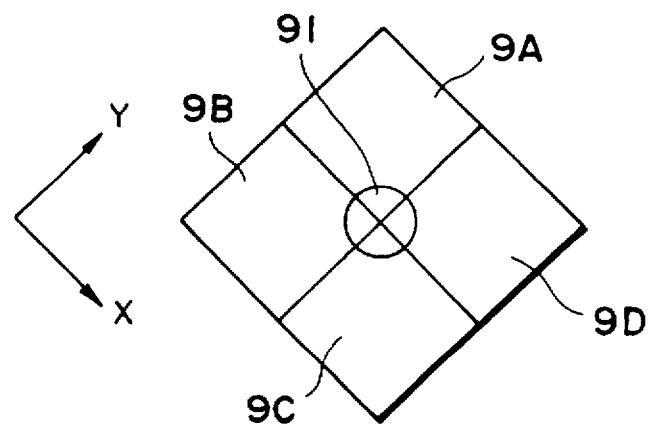

FIGS. 3A to 3C are schematic views explaining the operations of the inclination detecting mechanism for the luminous flux in the present invention. FIGS. 3A and 3B respectively show its configurations in two orthogonal planes including the optical axis AX. On the other hand, FIG. 3C shows the configuration of each light-receiving portion of the four-divided sensor 9 and the state of a spot formed thereon.

As shown in FIGS. 3A and 3B, the luminous flux emitted from an excimer laser, for example, has a rectangular cross section with a large aspect ratio. Accordingly, in the present invention, by way of a cylinder expander 40 composed of a pair of cylindrical lenses 40a and 40b, the luminous flux emitted from the excimer laser is shaped into a luminous flux having substantially a square cross section.

The luminous flux shaped into substantially a square cross section forms, by way of the condenser lens 8, an image on the four-divided sensor 9. Then, as shown in FIG. 3C, on the four-divided sensor 9 having four light-receiving portions 9A to 9D, a spot 91 is formed. As mentioned above, since the luminous flux is shaped by the cylinder expander 40 into substantially a square form, the spot 91 formed on the four-divided sensor 9 becomes substantially circular.

Based on signals $9a$ to $9d$ respectively output from the light-receiving portions 9A to 9D, the four-divided sensor 9 computes signals of $9a-9c$, $9b-9d$, and $9a+9b+9c+9d$. As mentioned above, the spot 91 is formed at the center of the four-divided sensor 9 when the center axis of the luminous flux coincides with the designed optical axis AX. Accordingly, when the angle of the mirror 2 is adjusted so as to satisfy the conditions of $9a-9c=0$, $9b-9d=0$, and $9a+9b+9c+9d\neq0$, the angle of the center axis of the luminous flux with respect to the optical axis AX can be appropriately changed so as to correct the inclination of the luminous flux.

In a specific example of computing in this case, X-direction displacement amount $\Delta X$ and Y-direction displacement amount $\Delta Y$ in FIG. 3C are respectively calculated as follows:

$$\Delta X=[(9d+9c)-(9a+9b)]/(9a+9b+9d+9c)$$

$$\Delta Y=[(9a+9d)-(9b+9c)]/(9a+9b+9d+9c)$$

Accordingly, when the angle of the mirror 2 is adjusted such that both of the displacement amounts ($\Delta X$, $\Delta Y$) become zero, the inclination of the luminous flux can be corrected.

Thus, in the present invention, since the inclination of the luminous flux is detected on the basis of the luminous flux which has been shaped into substantially a square form, without any difference in accuracy between the longitudinal and lateral directions of the four-divided sensor, highly accurate detection of the inclination and, accordingly, highly accurate correction of the inclination can be effected.

Figure 4:
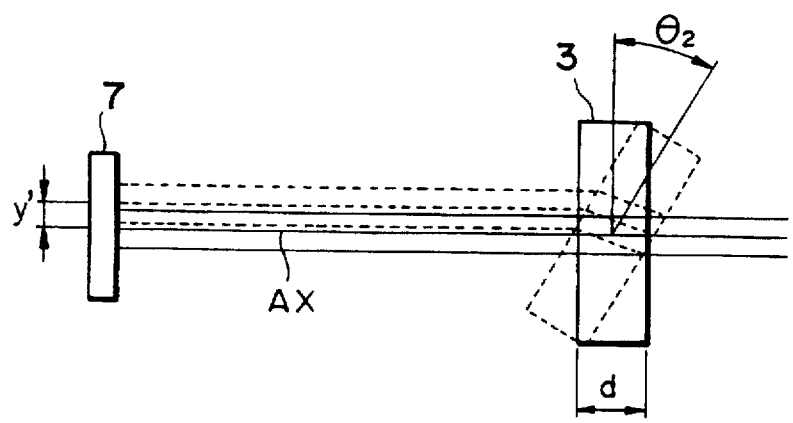
FIG. 4 is a schematic view explaining the principle of detecting a positional deviation of a luminous flux.

FIG. 4 is a schematic view explaining the principle of detecting the positional deviation of the luminous flux.

As shown in FIG. 4, a parallel luminous flux from an excimer laser, for example, enters the plane parallel plate 3 used for translating the luminous flux with respect to the designed optical axis AX. When the plane parallel plate 3 is disposed as indicated by a continuous line in the drawing, the luminous flux transmitted through the plane parallel plate 3 moves along the designed optical axis AX and, still as a parallel luminous flux, reaches the four-divided sensor 7. Then, the four-divided sensor 7 receives, at its center area, a rectangular luminous flux centered at the optical axis AX.

On the other hand, when the plane parallel plate 3 is rotated by an angle $\theta_2$ within the paper surface of FIG. 4 to a position indicated by a broken line, the luminous flux transmitted through the plane parallel plate 3 reaches the four-divided sensor 7 while being translated with respect to the designed optical axis AX. Then, the center of the rectangular luminous flux received on the four-divided sensor 7 shifts by a distance y' from the center of the four-divided sensor 7 (i.e., optical axis AX).

The distance y' is expressed by the following equation (2):

$$y'=d[\sin\theta_2-\cos\theta_2\tan\{\sin^{-1}(\sin\theta_2/n)\}] \qquad (2)$$

wherein d is the thickness of the plane parallel plate 3 and n is the refractive index of the plane parallel plate 3.

In this manner, based on the sum signal and difference signal of the light incident on the four light-receiving portions of the four-divided sensor 7, the positional deviation of the luminous flux with respect to the designed optical axis AX can be detected.

Figure 5A:
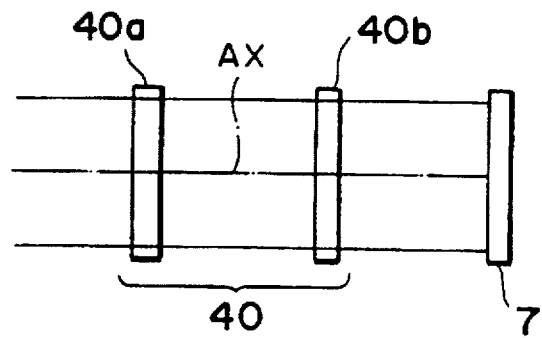
FIGS. 5A to 5C are schematic views explaining operations of a positional deviation detecting units for a luminous flux.
Figure 5B:
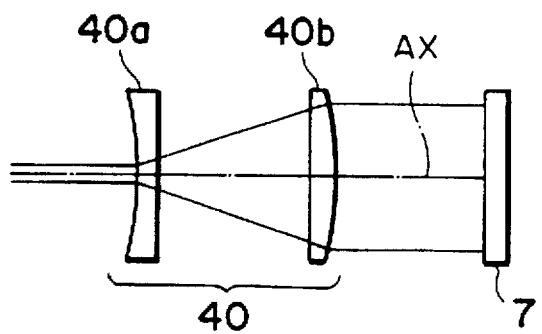
Figure 5C:
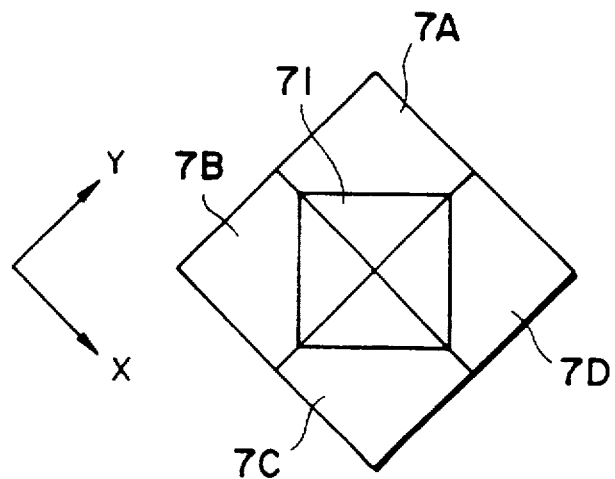

FIGS. 5A to 5C are schematic views explaining the operations of the positional deviation detecting mechanism for the luminous flux in the present invention. FIGS. 5A and 5B respectively show its configurations in two orthogonal planes including the optical axis AX. On the other hand, FIG. 5C shows the configuration of each light-receiving portion of the four-divided sensor 7 and the state of a luminous flux received thereby.

As shown in FIGS. 5A and 5B, by way of the cylinder expander 40 composed of a pair of the cylindrical lenses 40a and 40b, a rectangular luminous flux emitted from an excimer laser, for example, is shaped into a luminous flux having substantially a square cross section.

The luminous flux shaped into substantially a square form, still as a parallel luminous flux, reaches the four-divided sensor 7. Then, as shown in FIG. 5C, a square-shaped parallel luminous flux 71 is received on the four-divided sensor 7 having four light-receiving portions 7A to 7D.

Based on signals $7a$ to $7d$ respectively output from the light-receiving portions 7A to 7D, the four-divided sensor 7 computes signals of $7a-7c$, $7b-7d$, and $7a+7b+7c+7d$.

As mentioned above, substantially a square luminous flux is received at the center area of the four-divided sensor 7 when the center axis of the luminous flux coincides with the designed optical axis AX. Accordingly, when the angle of the plane parallel plate 3 is adjusted so as to satisfy the conditions of $7a-7c=0$, $7b-7d=0$, and $7a+7b+7c+7d\neq0$, the center axis of the luminous flux can be appropriately translated with respect to the optical axis AX so as to correct the positional deviation of the luminous flux.

In a specific example of computing in this case, X-direction displacement amount $\Delta X$ and Y-direction displacement amount $\Delta Y$ in FIG. 5C are respectively calculated as follows:

$$\Delta X=[(7d+7c)-(7a+7b)]/(7a+7b+7d+7c)$$

$$\Delta Y=[(7a+7d)-(7b+7c)]/(7a+7b+7d+7c)$$

Accordingly, when the angle of the plane parallel plate 3 is adjusted such that both of the displacement amounts ($\Delta X$, $\Delta Y$) become zero, the positional deviation of the luminous flux can be corrected.

Thus, in the present invention, since the inclination of the luminous flux is detected on the basis of the luminous flux which has been shaped into substantially a square form, without any difference in accuracy between the longitudinal and lateral directions of the four-divided sensor, highly accurate detection of the positional deviation and, accordingly, higly accurate correction of the positional deviation can be effected.

Embodiment 2

Figure 6A:
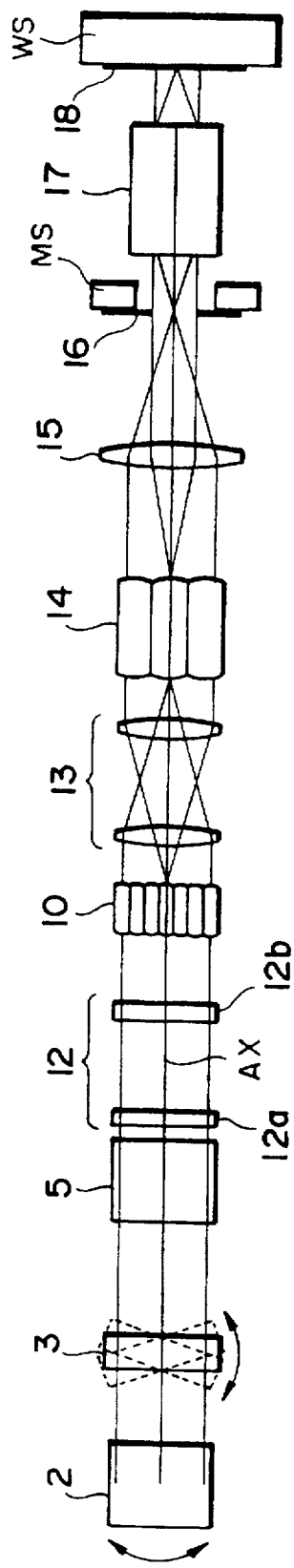
FIGS. 6A and 6B are schematic configurational views showing the projection exposure apparatus in accordance with Embodiment 2 of the present invention.
Figure 6B:
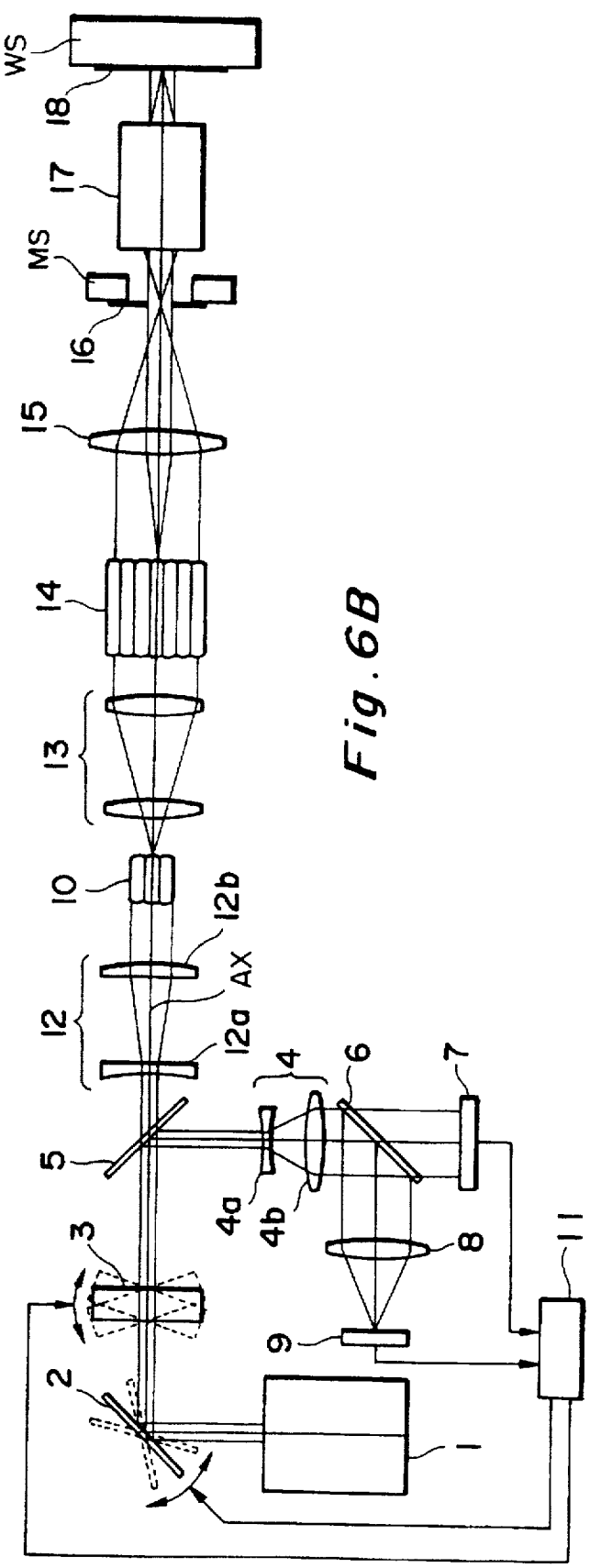

FIGS. 6A and 6B are schematic views showing a projection exposure apparatus in accordance with Embodiment 2 of the present invention in which an illumination apparatus of the present invention is incorporated. FIGS. 6A and 6B respectively show its configurations in two orthogonal planes including the optical axis.

In the projection exposure apparatus shown in FIGS. 6A and 6B, an illumination apparatus having a configuration similar to that shown in FIG. 1 is incorporated. The illumination apparatus incorporated in the projection exposure apparatus shown in FIGS. 6A and 6B basically differs from that of FIG. 1 only in that a cylinder expander 4 in the former is disposed between a half mirror 5 and a half mirror 6 whereas that of the latter is disposed between the plane parallel plate 3 and the half mirror 5. Accordingly, the elements in FIGS. 6A and 6B having substantially the same functions as those in FIG. 1 are referred to with the marks identical to those in FIG. 1.

The projection exposure apparatus shown in FIGS. 6A and 6B has a laser light source 1 such as an excimer laser which oscillates light having a wavelength of 248 nm or 193 nm. A rectangular parallel luminous flux supplied from the excimer laser 1 is made incident on the half mirror 5 by way of a mirror 2 and the plane parallel plate 3.

The luminous flux reflected by the half mirror 5 is shaped into a luminous flux having substantially a square cross section by way of the cylinder expander 4 composed of a pair of cylindrical lenses 4a and 4b and then enters the half mirror 6.

The light reflected by the half mirror 6 forms, by way of a condenser lens 8, an image upon a four-divided sensor 9. Thus, the four-divided sensor 9 can detect the inclination of the luminous flux with respect to its designed optical axis AX. The output of the four-divided sensor 9 is input into a control system 11.

On the other hand, the light transmitted through the half mirror 6 is guided, still as a parallel luminous flux, onto another four-divided sensor 7. Thus, the four-divided sensor 7 can detect the positional deviation of the luminous flux with respect to the optical axis AX. The output of the four-divided sensor 7 is also input to the control system 11.

Accordingly, the control system 11 drives and controls the mirror 2 and the plane parallel plate 3 so as to correct the inclination and positional deviation of the luminous flux.

On the other hand, the luminous flux transmitted through the half mirror 5 enters a cylinder expander 12 composed of a pair of cylindrical lenses 12a and 12b. Each of the cylindrical lenses 12a and 12b has a refractive power within the paper surface of FIG. 6B, while functioning as a plane parallel plate within the paper surface of FIG. 6A. Accordingly, the luminous flux entering the cylinder expander 12 is enlarged within the paper surface of FIG. 6B and shaped so as to coincide with the form of the inlet surface of a first optical integrator 10 which will be explained later.

The luminous flux shaped by the cylinder expander 12 enters the first optical integrator 10 which is a multiple light source image forming system. The luminous flux entering the first optical integrator 10 is two-dimensionally divided by a plurality of lens elements constituting the first optical integrator 10 so as to form a plurality of light source images, namely, secondary light sources, at the rear focal position of the first optical integrator 10.

The luminous fluxes from the plurality of light source images are converged by a condenser optical system 13 composed of a pair of lenses and then illuminates a second optical integrator 14 in a superposing manner. The luminous flux entering the second optical integrator 14 is two-dimensionally divided by a plurality of lens elements constituting the second optical integrator 14 so as to form a plurality of light source images, namely, tertiary light sources, at the rear focal position of the second optical integrator 14.

Here, the condenser optical system 13 makes the inlet surface of the first optical integrator 10 and that of the second optical integrator 14 conjugate with each other, while making the exit surface of the first optical integrator 10 and that of the second optical integrator 14 conjugate with each other.

Also, each lens element of the first and second optical integrators 10 and 14 has a biconvex lens form, for example. The parallel luminous flux entering each lens element is converged so as to form a light source image on the exit side of the lens element.

The luminous fluxes from a plurality of the light source images formed by way of the second optical integrator 14 are converged by a condenser lens 15 so as to illuminate, in a superposing manner, a mask 16 formed with a predetermined pattern. The mask 16 is supported by a mask stage MS and a wafer 18 is supported by a wafer stage WS. The mask stage MS and wafer stage WS are provided capable of traveling two-dimensionally within the orthogonal face to the surface of FIGS. 6A and 6B. The luminous flux transmitted through the mask 16 reaches, by way of a projection optical system 17, the wafer 18 which is positioned at its image surface. Thus, the pattern of the mask 16 is transferred onto the wafer 18 which is a photosensitive substrate.

In the projection exposure apparatus shown in FIGS. 6A and 6B, even when the rectangular luminous flux emitted from the excimer laser 1 is inclined or positionally deviated due to positional deviation of the light source or the like, the inclination and positional deviation of the luminous flux can be automatically corrected with high accuracy due to operations of the mirror 2, which is a luminous flux angle adjustment unit, and the plane parallel plate 3, which is a luminous flux translation unit, without adjusting the position of the excimer laser 1. Namely, the inclination and positional deviation of the luminous flux can be corrected not only during the initial adjustment step of the projection exposure apparatus but also during the exposure step.

In the conventional exposure apparatus, since exposure is successively effected while its wafer stage is two-dimensionally moved, vibrations may be caused by the two-dimensional movement of the wafer stage. In particular, in the scan type projection exposure apparatus in which the mask and the photosensitive substrate are exposed to light while each is being scanned with respect to the projection optical system, both mask stage and substrate stage may move during the exposure, thereby generating vibrations. Accordingly, in the scan type projection exposure apparatus, in particular, the inclination and positional deviation of the luminous flux is likely to occur due to these vibrations during the exposure step as well.

In the projection exposure apparatus in accordance with the foregoing embodiment, a rectangular luminous flux substantially coinciding with the cross-sectional form of the first optical integrator 10 can be made incident thereon along the designed optical axis AX with neither inclination nor positional deviation. As a result, the change in exposure light quantity resulting from the positional deviation of the luminous flux incident on the first optical integrator 10 can be minimized. Also, the fluctuation in illuminance resulting from the inclination of the luminous flux incident on the first optical integrator 10 can be minimized. As a result, the exposure step can be stably performed with little change in exposure light quantity and little fluctuation in illuminance.

Embodiment 3

In the following, Embodiment 3 will be explained with reference to FIGS. 7A and 7B.

FIGS. 7A and 7B show an example in which, as in the case of Embodiment 2, the illumination apparatus of the present invention is applied to a projection exposure apparatus. FIGS. 7A and 7B respectively show its configurations in two orthogonal planes including the optical axis.

In the above-mentioned Embodiment 2, the beam expander (cylinder expander) 4 is disposed in an optical path before the divided luminous fluxes are respectively guided to the four-divided sensor 7 used for detecting the positional deviation of the luminous flux and the four-divided sensor 9 used for detecting the inclination of the luminous flux, namely, in an optical path between the half mirror 6 and the light source 1, thereby making the beam expander 4 function as a beam shaping means for both four-divided sensors. However, beam expanders may be disposed in the respective optical paths divided by the half mirror 6, namely, in the optical path for detecting positional deviation and the optical path for detecting angular deviation.

Accordingly, FIGS. 7A and 7B Show an example in which beam expanders 41 and 42 are respectively disposed in the optical path for detecting positional deviation and the optical path for detecting angular deviation. Here, Embodiment 3 differs from Embodiment 2 in that the beam expander 41 composed of a cylindrical lens 41a having a negative refractive power and a cylindrical lens 41b having a positive refractive power is disposed in the positional deviation detecting light path between the half mirror 6 and the four-divided sensor 7 while the beam expander 42 composed of a cylindrical lens 42a having a negative refractive power and a cylindrical lens 42b having a positive refractive power is disposed in the angular deviation detecting light path between the half mirror 6 and the four-divided sensor 9.

Here, the beam expander 41 shown in FIG. 7B has predetermined magnifications in orthogonal directions such that the luminous flux having a rectangular (oblong) cross section incident thereon is shaped into a luminous flux having a square cross section. For example, assuming that the width or size of the luminous flux having a rectangular (oblong) cross section incident on the beam expander 41 in the paper surface direction of FIG. 7B is $W_{H11}$, the width or size of the luminous flux having a rectangular (oblong) cross section emitted from the beam expander 41 in the paper surface direction of FIG. 7B is $W_{H12}$, the width or size of the luminous flux having a rectangular (oblong) cross section incident on the beam expander 41 in the direction perpendicular to the paper surface of FIG. 7B is $W_{V11}$, the width or size of the luminous flux having a rectangular (oblong) cross section emitted from the beam expander 41 in the direction perpendicular to the paper surface of FIG. 7B is $W_{V12}$, the magnification of the beam expander 41 in the paper surface direction of FIG. 7B is $\beta_{H1}$, and the magnification of the beam expander 41 in the direction perpendicular to the paper surface of FIG. 7B is $\beta_{V1}$, the following relationships are established:

$$W_{H12} = \beta_{H1} \times W_{H11} \tag{3}$$

$$W_{V12} = \beta_{V1} \times W_{V11} \tag{4}$$

Accordingly, assuming that the beam cross section is shaped into a square form by the beam expander 41, since the relationship of $W_{H12} = W_{V12}$ is established, the above-mentioned equations (3) and (4) can be modified into the following equation (5):

$$\beta_{H1}/\beta_{V1} = W_{V11}/W_{H11} \tag{5}$$

Therefore, the beam expander 41 is configured so as to satisfy the above-mentioned equation (5). Thus, in FIG. 7B, since the refractive power in the direction perpendicular to the paper surface is zero, namely, the magnification $\beta_{V1}=1$, the beam expander 41 is configured, in view of the above-mentioned equation (5), so as to satisfy the following equation (6):

$$\beta_{H1} = W_{V11}/W_{H11} = W_{H12}/W_{H11} \tag{6}$$

On the other hand, when the laser beam oscillated at the excimer laser 1 has the same angle of divergence in directions orthogonal to each other (the paper surface direction of FIG. 7B and the direction orthogonal thereto), the beam expander 42 disposed in the angular deviation detecting optical path between the half mirror 6 and the four-divided sensor 9 is preferably configured so as to satisfy the above-mentioned equation (5) or (6). However, when the laser beam oscillated at the excimer laser 1 has different angles of divergence in directions orthogonal to each other (the paper surface direction of FIG. 7B and the direction orthogonal thereto), the spot formed on the four-divided sensor 9 by way of the beam expander 42 and condenser lens 8 may become ellipsoidal according to the difference in angles of divergence between the orthogonal directions, thereby deteriorating the accuracy in measurement. Accordingly, in this case, it is preferable that the magnifications of the beam expander 42 in the orthogonal directions be set or the condenser lens 8 be configured so as to have different refractive powers in the orthogonal directions such that the spot formed on the four-divided sensor 9 has a circular form.

Here, the beam expander 41 may be omitted when high accuracy in detection is not required for only the positional deviation of the luminous flux, while the beam expander 42 may be omitted when high accuracy in detection is not required for only the angular deviation of the luminous flux. Also, when no consideration is necessary for the positional deviation of the luminous flux, the beam expander 41 and the four-divided sensor 7 may be omitted and a reflective mirror may be used in place of the half mirror 6 such that only the angular deviation of the luminous flux can be detected by the four-divided sensor 9. Further, when no consideration is necessary for the angular deviation of the luminous flux, the half mirror 6, the beam expander 42, and the four-divided sensor 9 may be omitted such that the only the positional deviation of the luminous flux can be detected by the four-divided sensor 7.

While the foregoing embodiments use an excimer laser as the light source, the present invention may be applied to other kinds of light supply units which can supply rectangular or ellipsoidal parallel luminous fluxes.

Also, while a reflective mirror and a plane parallel plate are respectively used as the luminous flux angle adjustment unit and the luminous flux translation unit in the foregoing embodiments, an appropriate luminous angle adjustment unit and an appropriate flux translation unit comprising other optical elements such as a prism may be used to constitute the illumination apparatus of the present invention.

While the beam expander (luminous flux shaping unit) is constituted by a cylindrical lens having a negative refractive power and a cylindrical lens having a positive refractive power in the foregoing embodiments, the beam expander may be constituted by two cylindrical lenses each having a positive refractive power. Also, as can be seen from the above-mentioned equation (5), the beam expander (luminous flux shaping unit) may be constituted by a plurality of toric lenses having different refractive powers in orthogonal directions.

While the foregoing embodiments mainly use a plurality of lens elements as the optical integrator 10 and 14, the present invention may be applied to an optical fiber bundle, a rod-like internal reflection type optical member and others mentioned in the U.S. Pat. No. 4,918,583 as the optical integrator. The U.S. Pat. No. 4,918,583 is hereby incorporated by reference.

As explained in the foregoing, in the illumination apparatus of the present invention, the inclination and positional deviation of the luminous flux can be corrected with high accuracy due to operations of the luminous flux angle adjustment unit and the luminous flux translation unit without finely adjusting the position of the light source.

Accordingly, when the illumination apparatus of the present invention is incorporated as an illumination apparatus in a projection exposure apparatus, change in exposure light quantity and fluctuation in illuminance can be suppressed so as to stably perform exposure.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 120862/1995 filed on Apr. 21, 1995 is hereby incorporated by reference.

What is claimed is:

1. An illumination apparatus comprising:

light supply means for supplying parallel luminous flux;

luminous flux shaping means for shaping the parallel luminous flux supplied from said light supply means into parallel luminous flux having substantially a square or circular cross section;

positional deviation detecting means for detecting, based on the parallel luminous flux having substantially a square or circular cross section shaped by said luminous flux shaping means, positional deviation of the parallel luminous flux supplied from said light supply means with respect to a predetermined optical axis; and luminous flux translation means for translating, based on an output from said positional deviation detecting means, said parallel luminous flux supplied from said light supply means with respect to said predetermined optical axis so as to correct said positional deviation.

2. An illumination apparatus according to claim 1, wherein said luminous flux translation means includes a plane parallel plate for translating the parallel luminous flux supplied from said light supply means.

3. An illumination apparatus comprising:

light supply means for supplying parallel luminous flux;

luminous flux shaping means for shaping the parallel luminous flux supplied from said light supply means into parallel luminous flux having substantially a square or circular cross section;

inclination detecting means for detecting, based on the parallel luminous flux having substantially a square or circular cross section shaped by said luminous flux shaping means, inclination of the parallel luminous flux supplied from said light supply means with respect to a predetermined optical axis; and luminous flux angle adjustment means for adjusting, based on an output from said inclination detecting means, an angle of said parallel luminous flux supplied from said light supply means with respect to said predetermined optical axis.

4. An illumination apparatus according to claim 3, wherein said luminous flux angle adjustment means includes a reflective mirror for deflecting the parallel luminous flux supplied from said light supply means.

5. An illumination apparatus according to claim 3, further comprising:

positional deviation detecting means for detecting, based on the parallel luminous flux having substantially a square or circular cross section shaped by said luminous flux shaping means, positional deviation of the parallel luminous flux supplied from said light supply means with respect to a predetermined optical axis and luminous flux translation means for translating, based on an output from said positional deviation detecting means, said parallel luminous flux supplied from said light supply means with respect to said predetermined optical axis so as to correct said positional deviation.

6. An illumination apparatus according to claim 5, further comprising optical path dividing means for dividing an optical path of the parallel luminous flux supplied from said light supply means, said luminous flux shaping means being disposed in an optical path between said light supply means and said optical path dividing means, and said inclination detecting means and said positional deviation detecting means effecting detection based on luminous flux taken out by way of said optical path dividing means.

7. An illumination apparatus according to claim 5, further comprising optical path dividing means for dividing an optical path of the parallel luminous flux supplied from said light supply means, said luminous flux shaping means shaping luminous flux taken out by way of said optical path dividing means and guiding shaped luminous flux to said inclination detecting means and said positional deviation detecting means.

8. An illumination apparatus according to claim 5, wherein said luminous flux translation means includes a plane parallel plate for translating the parallel luminous flux supplied from said light supply means.

9. An illumination apparatus according to claim 3, wherein said inclination detecting means includes a condenser optical system for condensing parallel luminous flux disposed at a position where the parallel luminous flux having substantially a square or circular cross section shaped by said luminous flux shaping means is received, and a detector disposed at a position where the parallel luminous flux is condensed by said condenser optical system.

10. A projection exposure apparatus comprising:

an illumination apparatus including light supply means for supplying parallel luminous flux; luminous flux shaping means for shaping the parallel luminous flux supplied from said light supply means into parallel luminous flux having substantially a square or circular cross section; positional deviation detecting means for detecting, based on the parallel luminous flux having substantially a square or circular cross section shaped by said luminous flux shaping means, positional deviation of the parallel luminous flux supplied from said light supply means with respect to a predetermined optical axis; and luminous flux translation means for translating, based on an output from said positional deviation detecting means, said parallel luminous flux supplied from said light supply means with respect to said predetermined optical axis so as to correct said positional deviation;

an exposure illumination optical system having an optical integrator for irradiating a mask formed with a predetermined pattern with parallel luminous flux supplied from said illumination apparatus by way of said optical integrator; and a projection optical system for forming a pattern image from said mask upon a photosensitive substrate.

11. A projection exposure apparatus according to claim 10, wherein said luminous flux translation means includes a plane parallel plate for translating the parallel luminous flux supplied from said light supply means.

12. A projection exposure apparatus comprising:

an illumination apparatus including light supply means for supplying parallel luminous flux; luminous flux shaping means for shaping the parallel luminous flux supplied from said light supply means into parallel luminous flux having substantially a square or circular cross section; inclination detecting means for detecting, based on the parallel luminous flux having substantially a square or circular cross section shaped by said luminous flux shaping means, inclination of the parallel luminous flux supplied from said light supply means with respect to a predetermined optical axis; and luminous flux angle adjustment means for adjusting, based on an output from said inclination detecting means, an angle of said parallel luminous flux supplied from said light supply means with respect to said predetermined optical axis;

an exposure illumination optical system having an optical integrator for irradiating a mask formed with a predetermined pattern with parallel luminous flux supplied from said illumination apparatus by way of said optical integrator; and a projection optical system for forming a pattern image from said mask upon a photosensitive substrate.

13. A projection exposure apparatus according to claim 12, wherein said luminous flux angle adjustment means includes a reflective mirror for deflecting the parallel luminous flux supplied from said light supply means.

14. A projection exposure apparatus according to claim 12, wherein said illumination apparatus further comprises:

positional deviation detecting means for detecting, based on the parallel luminous flux having substantially a square or circular cross section shaped by said luminous flux shaping means, positional deviation of the parallel luminous flux supplied from said light supply means with respect to a predetermined optical axis and luminous flux translation means for translating, based on an output from said positional deviation detecting means, said parallel luminous flux supplied from said light supply means with respect to said predetermined optical axis so as to correct said positional deviation.

15. A projection exposure apparatus according to claim 14, wherein said illumination apparatus further comprises optical path dividing means for dividing an optical path of the parallel luminous flux supplied from said light supply means, said luminous flux shaping means shaping luminous flux taken out by way of said optical path dividing means and guiding shaped luminous flux to said inclination detecting means and said positional deviation detecting means.

16. A projection exposure apparatus according to claim 14, wherein said luminous flux translation means includes a plane parallel plate for translating the parallel luminous flux supplied from said light supply means.

17. A projection exposure apparatus according to claim 14, wherein said inclination detecting means includes a condenser optical system for condensing parallel luminous flux disposed at a position where the parallel luminous flux having substantially a square or circular cross section shaped by said luminous flux shaping means is received, and a detector disposed at a position where the parallel luminous flux is condensed by said condenser optical system.

18. A projection exposure apparatus according to claim 14, wherein said illumination apparatus further comprises optical path dividing means for dividing an optical path of the parallel luminous flux supplied from said light supply means, said luminous flux shaping means being disposed in an optical path between said light supply means and said optical path dividing means, and said inclination detecting means and said positional deviation detecting means effecting detection based on luminous flux taken out by way of said optical path dividing means.

19. A projection exposure apparatus according to claim 12, wherein said inclination detecting means includes a condenser optical system for condensing parallel luminous flux disposed at a position where the parallel luminous flux having substantially a square or circular cross section shaped by said luminous flux shaping means is received, and a detector disposed at a position where the parallel luminous flux is condensed by said condenser optical system.

20. A projection exposure apparatus comprising:

a first supporting member for supporting a mask formed with a predetermined pattern;

a second supporting member for supporting a photosensitive substrate;

an illumination optical system disposed in association with said mask for illuminating said mask;

a projection optical system disposed between said mask and said photosensitive substrate for forming a pattern image of said mask upon said photosensitive substrate;

wherein said illumination optical system includes a light supply unit for supplying light flux; a light flux shaping unit disposed in a light path of the light flux supplied from said light supply unit for shaping the light flux into light flux having a predetermined cross section shape; a positional deviation detecting unit for detecting positional deviation of the light flux supplied from said light supply unit with respect to a predetermined optical axis; and a light flux translation unit for translating, based on an output from said positional deviation detecting unit, the light flux supplied from said light supply unit with respect to said predetermined optical axis so as to correct said positional deviation.

21. A projection exposure apparatus according to claim 20 wherein said illumination optical system further comprises an optical integrator disposed between said light flux shaping unit and said mask for forming a plurality of light sources and for superimposing light fluxes form said plurality of said light sources on said mask.

22. A method of projection-exposing using the projection exposure apparatus according to claim 21 comprising the steps of:

illuminating the mask by said illumination optical system; and projection-exposing the predetermined pattern formed on the mask upon the photosensitive substrate through said projection optical system.

23. A method of projection-exposing using the projection exposure apparatus according to claim 21 comprising the steps of:

illuminating the mask by said illumination optical system; and projection-exposing the predetermined pattern formed on the mask upon the photosensitive substrate through said projection optical system while moving the mask and the photosensitive substrate with respect to said projection optical system.

24. A method of projection-exposing using the projection exposure apparatus according to claim 20 comprising the steps of:

illuminating the mask by said illumination optical system; and projection-exposing the predetermined pattern formed on the mask upon the photosensitive substrate through said projection optical system.

25. A method of projection-exposing using the projection exposure apparatus according to claim 20 comprising the steps of:

illuminating the mask by said illumination optical system; and projection-exposing the predetermined pattern formed on the mask upon the photosensitive substrate through said projection optical system while moving the mask and the photosensitive substrate with respect to said projection optical system.

26. A projection exposure apparatus comprising:

a first supporting member for supporting a mask formed with a predetermined pattern;

a second supporting member for supporting a photosensitive substrate;

an illumination optical system disposed in association with said mask for illuminating said mask;

a projection optical system disposed between said mask and said photosensitive substrate for forming a pattern image of said mask upon said photosensitive substrate;

wherein said illumination optical system includes a light supply unit for supplying light flux; a light flux shaping unit disposed in a light path of the light flux supplied from said light supply unit for shaping the light flux into light flux having a predetermined cross section shape; an inclination detecting unit for detecting an inclination of the light flux supplied from said light supply unit with respect to a predetermined optical axis; and a light flux angle adjustment unit for adjusting, based on an output from said inclination detecting unit, an angle of the light flux supplied from said light supply unit with respect to said predetermined optical axis.

27. A projection exposure apparatus according to claim 26 wherein said illumination optical system further comprises an optical integrator disposed between said light flux shaping unit and said mask for forming a plurality of light sources and for superimposing light fluxes from said plurality of said light sources on said mask.

28. A projection exposure apparatus according to claim 22, further comprising:

a positional deviation detecting unit for detecting, based on the parallel luminous flux having substantially a square or circular cross section shaped by said luminous flux shaping unit, positional deviation of the parallel luminous flux supplied from said light supply unit with respect to said predetermined optical axis and a luminous flux translation unit for translating, based on an output from said positional deviation detecting unit, said parallel luminous flux supplied from said light supply unit with respect to said predetermined optical axis so as to correct said positional deviation.

29. A projection exposure apparatus according to claim 28, wherein said luminous flux translation unit includes a plane parallel plate for translating the parallel luminous flux supplied from said light supply unit, and said luminous flux angle adjustment unit includes a reflective mirror for deflecting the parallel luminous flux supplied from said light supply unit.

30. A projection exposure apparatus according to claim 29, wherein said first supporting member and said second supporting member are moved with respect to said projection optical system while exposing the predetermined pattern formed on the mask upon the photosensitive substrate.

31. A method of projection-exposing using the projection exposure apparatus according to claim 29 comprising the steps of:

illuminating the mask by said illumination optical system; and projection-exposing the predetermined pattern formed on the mask upon the photosensitive substrate through said projection optical system.

32. A method of projection-exposing using the projection exposure apparatus according to claim 29 comprising the steps of:

illuminating the mask by said illumination optical system; and projection-exposing the predetermined pattern formed on the mask upon the photosensitive substrate through said projection optical system while relatively moving the mask and the photosensitive substrate with respect to said projection optical system.

33. A projection exposure apparatus according to claim 28, wherein said inclination detecting unit includes a condenser optical system for condensing parallel luminous flux disposed at a position where the parallel luminous flux having substantially a square or circular cross section shaped by said luminous flux shaping unit is received, and a detector disposed at a position where the parallel luminous flux is condensed by said condenser optical system.

34. A projection exposure apparatus according to claim 33, wherein said first supporting member and said second supporting member are moved with respect to said projection optical system while exposing the predetermined pattern formed on the mask upon the photosensitive substrate.

35. A method of projection-exposing using the projection exposure apparatus according to claim 33 comprising the steps of:

illuminating the mask by said illumination optical system; and projection-exposing the predetermined pattern formed on the mask upon the photosensitive substrate through said projection optical system.

36. A method of projection-exposing using the projection exposure apparatus according to claim 33 comprising the steps of:

illuminating the mask by said illumination optical system; and projection-exposing the predetermined pattern formed on the mask upon the photosensitive substrate through said projection optical system while relatively moving the mask and the photosensitive substrate with respect to said projection optical system.

37. A projection exposure apparatus according to claim 28, further comprising:

an optical path dividing unit for dividing an optical path of the parallel luminous flux supplied from said light supply unit;

said luminous flux shaping unit being disposed in the optical path between said light supply unit and said optical path dividing unit; and said inclination detecting unit and said positional deviation detecting unit effecting detection based on luminous flux taken out by way of said optical path dividing unit.

38. A projection exposure apparatus according to claim 37, wherein said luminous flux translation unit includes a plane parallel plate for translating the parallel luminous flux supplied from said light supply unit, and said luminous flux angle adjustment unit includes a reflective mirror for deflecting the parallel luminous flux supplied from said light supply unit.

39. A projection exposure apparatus according to claim 37, wherein said inclination detecting unit includes a condenser optical system for condensing parallel luminous flux disposed at a position where the parallel luminous flux having substantially a square or circular cross section shaped by said luminous flux shaping unit is received, and a detector disposed at a position where the parallel luminous flux is condensed by said condenser optical system.

40. A projection exposure apparatus according to claim 28, further comprising:

an optical path dividing unit for dividing an optical path of the parallel luminous flux supplied from said light supply unit, said luminous flux shaping unit shaping luminous flux taken out by way of said optical path dividing unit and guiding shaped luminous flux to said inclination detecting unit and said positional deviation detecting unit.

41. A projection exposure apparatus according to claim 40, wherein said luminous flux translation unit includes a plane parallel plate for translating the parallel luminous flux supplied from said light supply unit, and said luminous flux angle adjustment unit includes a reflective mirror for deflecting the parallel luminous flux supplied from said light supply unit.

42. A projection exposure apparatus according to claim 40, wherein said inclination detecting unit includes a condenser optical system for condensing parallel luminous flux disposed at a position where the parallel luminous flux having substantially a square or circular cross section shaped by said luminous flux shaping unit is received, and a detector disposed at a position where the parallel luminous flux is condensed by said condenser optical system.

43. A projection exposure apparatus according to claim 28, wherein said first supporting member and said second supporting member are moved with respect to said projection optical system while exposing the predetermined pattern formed on the mask upon the photosensitive substrate.

44. A method of projection-exposing using the projection exposure apparatus according to claim 28 comprising the steps of:

illuminating the mask by said illumination optical system; and projection-exposing the predetermined pattern formed on the mask upon the photosensitive substrate through said projection optical system.

45. A method of projection-exposing using the projection exposure apparatus according to claim 28 comprising the steps of:

illuminating the mask by said illumination optical system; and projection-exposing the predetermined pattern formed on the mask upon the photosensitive substrate through said projection optical system while relatively moving the mask and the photosensitive substrate with respect to said projection optical system.

46. A method of projection-exposing using the projection exposure apparatus according to claim 26 comprising the steps of:

illuminating the mask by said illumination optical system; and projection-exposing the predetermined pattern formed on the mask upon the photosensitive substrate through said projection optical system.

47. A method of projection-exposing using the projection exposure apparatus according to claim 26 comprising the steps of:

illuminating the mask by said illumination optical system; and projection-exposing the predetermined pattern formed on the mask upon the photosensitive substrate through said projection optical system while relatively moving the mask and the photosensitive substrate with respect to said projection optical system.

* * * * *